United States Patent
Chan et al.

(10) Patent No.: US 12,381,179 B2
(45) Date of Patent: Aug. 5, 2025

(54) MODULAR LOW LATENCY ELECTRICAL SEQUENCE FOR DIE-TO-DIE INTERFACE

(71) Applicant: Intel Corporation, Santa Clara, CA (US)

(72) Inventors: Phaik Yi Chan, Bayan Lepas (MY); Ting Ting Teh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 636 days.

(21) Appl. No.: 17/693,005

(22) Filed: Mar. 11, 2022

(65) Prior Publication Data

US 2022/0199573 A1 Jun. 23, 2022

(51) Int. Cl.
*H01L 25/00* (2006.01)
*H01L 25/065* (2023.01)

(52) U.S. Cl.
CPC ... *H01L 25/0652* (2013.01); *H01L 2225/06513* (2013.01)

(58) Field of Classification Search
CPC ....... H01L 25/0652; H01L 2225/06513; H01L 25/18; H01L 2224/16145; H01L 2224/1703; H01L 2224/17181; H01L 2225/06517; H01L 2924/15311; H04B 3/548; H04B 3/56; H04B 1/48; H04B 2001/485; H04W 52/028; Y02D 10/00
See application file for complete search history.

(56) References Cited

U.S. PATENT DOCUMENTS

| | | | |
|---|---|---|---|
| 2019/0068397 A1* | 2/2019 | Chen | H04L 12/40 |
| 2020/0098621 A1* | 3/2020 | Bharath | H01L 25/18 |
| 2022/0319569 A1* | 10/2022 | Veches | G11C 5/063 |
| 2023/0268637 A1* | 8/2023 | Dutta | H01L 24/96 |
| | | | 343/904 |

OTHER PUBLICATIONS

EPO Extended European Search Report in EP Application Serial No. 23151127.0 mailed on Jul. 14, 2023 (10 pages).

* cited by examiner

*Primary Examiner* — Ping Y Hsieh
(74) *Attorney, Agent, or Firm* — Alliance IP, LLC

(57) ABSTRACT

A system comprising a first die comprising a first receiver and a first transmitter to couple to a link between the first die and a second die comprising a second receiver and a second transmitter; and circuitry to place the first receiver and first transmitter into isolation modes; provide a first signal to the second die to request placement of the second transmitter into a deisolation mode; place the first receiver and first transmitter into deisolation modes responsive to a second signal from the second die; and provide a third signal to the second die to request placement of the second receiver into a deisolation mode.

20 Claims, 11 Drawing Sheets

ISOLATION MODE: RX_ISOCTRL_B=0, OUT=ISOLATION SAFE VALUE
DEISOLATION MODE: RX_ISOCTRL_B=1, OUT=CROSS-DIE SIGNAL

ISOLATION MODE: TX_ISOCTRL_B=0, OUT=0;
DEISOLATION MODE: TX_ISOCTRL_B=1, OUT=PROTOCOL LAYER

MODULAR LOW LATENCY ELECTRICAL SEQUENCE FOR DIE-TO-DIE INTERFACE

BACKGROUND

A computing system may comprise multiple dies that are coupled together via a communication link. A die may have a receiver and a transmitter that communicates with a corresponding transmitter and receiver of another die.

BRIEF DESCRIPTION OF THE DRAWINGS

Like reference numbers and designations in the various drawings indicate like elements.

DETAILED DESCRIPTION

Figure 1:
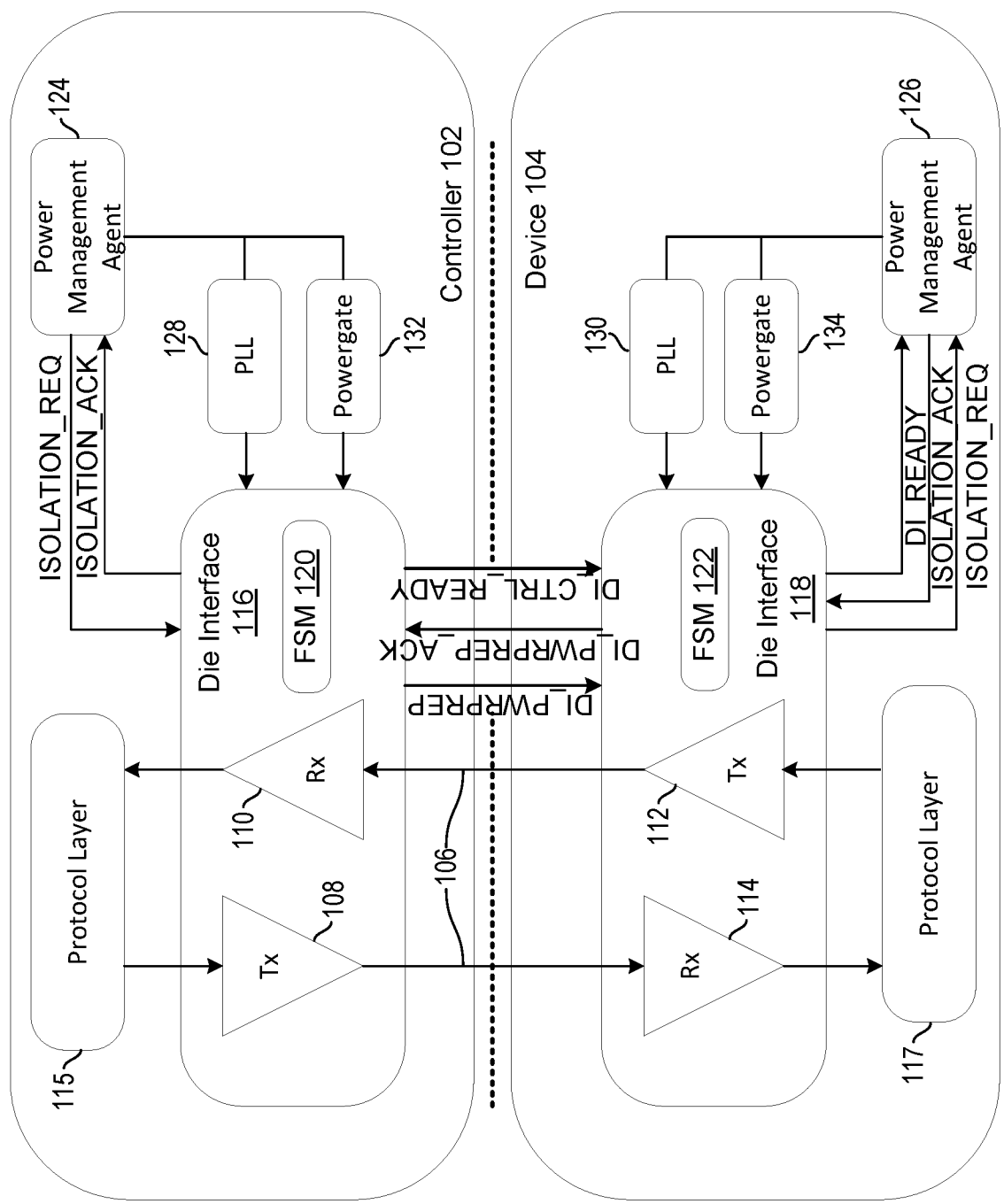
FIG. 1 illustrates a system to implement a modular low latency electrical sequence for a die-to-die interface in accordance with certain embodiments.

FIG. 1 illustrates a system 100 to implement a modular low latency electrical sequence for a die-to-die (D2D) interface in accordance with certain embodiments. System 100 includes a first die (controller 102) and a second die (device 104) coupled together by a D2D link 106 (the dies may also be referred to as dielets, chips, or chiplets). The D2D link includes a lane from a transmitter (Tx) 108 of the controller 102 to the receiver (Rx) 114 of the device 104 and a lane from the Tx 112 of the device 104 to the Rx 110 of the controller 102 (in other embodiments, a D2D link may have any suitable number of lanes between Tx and Rx pairs). The Tx 108 and Rx 110 are part of die interface 116, which also comprises a finite state machine (FSM) 120. The Tx 112 and Rx 114 are part of die interface 118, which also comprises FSM 122. During normal operation of the link 106, data may pass (in either direction) between protocol layer 115 of the controller 102 and protocol layer 117 of the device 104 (after passing through die interface 116, link 106, and die interface 118). The respective protocol layers may comprise any suitable logic for formatting data according to a particular communication protocol for transmission over the link 106 and for extracting data received over the link.

Each die may also include a power management agent (e.g., 124, 126) and supporting circuitry for the die interfaces 116 and 118, such as phase locked loops (PLLs) 128 and 130 and powergates 132 and 134. Each die may be in the same package, which may, in some embodiments, include one or more additional dies.

Various client disaggregation products support independent power delivery structures and power-gating across different dies to reduce cross-die power management flow dependency and maximize power savings. Two different dielets may not be guaranteed to power up/down at the same time as this may induce electrical risk on the D2D interconnect circuits.

Figure 2:
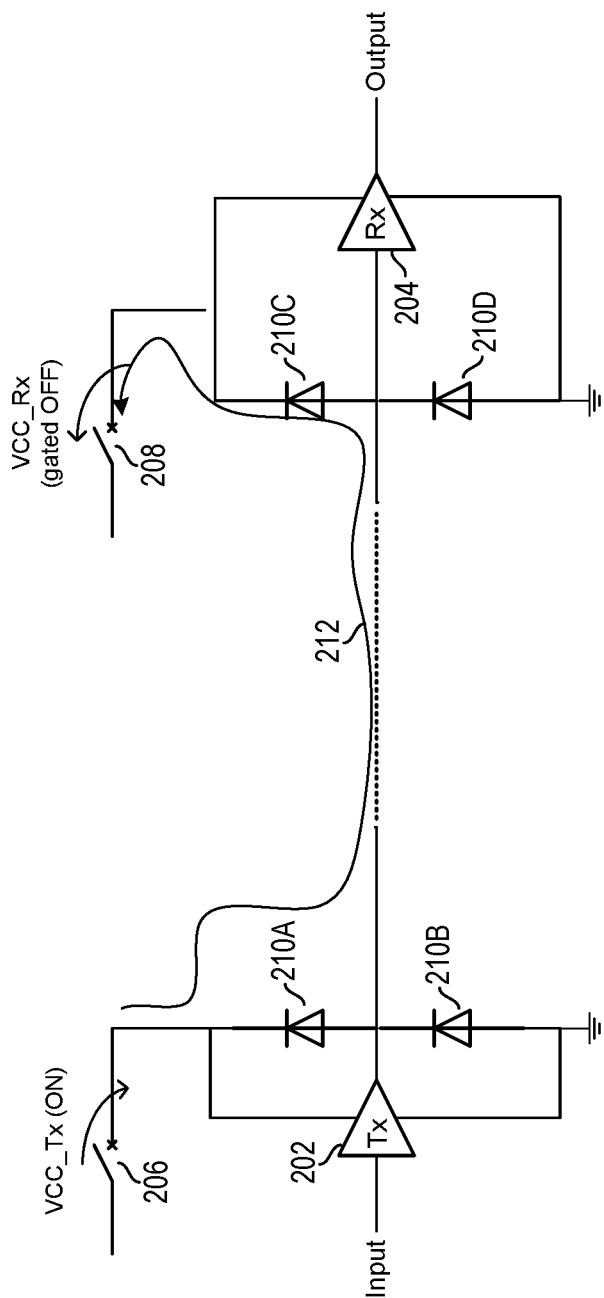
FIG. 2 illustrates a short circuit current that may occur in a die-to-die interface in accordance with certain embodiments.

Such risk is illustrated in FIG. 2. When the Tx driver 202 is powered down and the Rx buffer 204 remains powered up, floating gates and DC current may be present for the devices in the Rx buffer 204. When the Tx driver 202 remains powered up and the Rx buffer 204 is powered down, a ground loop path 212 may occur, causing latch-up on electrostatic discharge (ESD) diodes 210 in the receiver circuits.

In some systems with independent dielet power gating, the isolation mechanism is only intended to protect devices on a receiver dielet when a transmitter dielet is powered off, while leaving the ESD diodes in always on power rail in order to protect the device from short circuit current. However, keeping the ESD diode on with an ungated power supply causes excessive use of power (in the form of leakage) and power delivery complexity in circuit design integration.

In various embodiments of the present disclosure a low latency electrical sequence may be performed on a D2D interconnect to implement a quiescence handshake to protect the D2D interconnect devices. Some embodiments may provide an autonomous cross-die communication to allow dielets to transition power state safely on a desegregation chip with an independent power delivery structure for each dielet. The flow has a low transition latency to move the dielet into an electrical idle state or to be brought up to an active state. Various embodiments simplify boot flow and power delivery for disaggregation chiplets by removing dependency on the power sequence between chiplets and may be applicable to any suitable power domain crossing. In some embodiments, the isolation protection may also be bidirectional, isolating both a transmitter and receiver (unlike typical solutions which only protect receiver devices when the transmitter is floating).

Various embodiments of the present disclosure may provide one or more of the following technical advantages: power saving due to each dielet being independently power gated, power delivery simplification as supply rails on both sides of the chip do not need to be matched and one or more ESD diodes may be placed on a gated supply (in other words, the entire die interface may be powered by a single gated supply rail), improvement of power and performance efficiency due to a shorter flow transition latency, and scalability and modularity as the same physical interface for the sequence is reusable on different dielets with a simple power management flow.

Returning again to FIG. 1, two electrical requirements may be present for the die interfaces 116 and 118. First, when the Rx (e.g., 110, 114) of a first die is powered down, the Tx (e.g., 108, 112) of the other die only drives low if powered up. This may prevent ESD latch-up due to a ground loop path when the Rx is powered down. Second, when the Tx of a first die is powered down, the Rx of the second die is placed in isolation mode if it remains powered up (in order to protect the DC current path on the Rx). Placing an Rx into isolation mode may include, e.g., decoupling it from its counterpart Tx on another chip and/or forcing the input of the Rx to a known state value (e.g., logic 0 or logic 1).

In various embodiments, the sequence may be implemented using a 3-wire communication interface between the chiplets (e.g., between die interface 116 and die interface 118). The 3-wire communication interface may include a dedicated wire for each of the signals DI_PWRPREP, DI_PWRPREP_ACK, and DI_CTRL_READY as illustrated in FIG. 1. In at least some embodiments, the only signals that are carried on the 3-wire interface are these respective signals.

The DI_PWRPREP signal may be initiated by the dielet acting as the controller 102. The DI_PWRPREP signal is used to request the dielet acting as the device 104 to perform electrical preparation for its link, which (depending on the value or sequence of the DI_PWRPREP signal) includes placing both its Rx 114 and Tx 112 into isolation mode (e.g., decoupling them from the protocol layer 117) or deisolation mode (e.g., coupling them to the protocol layer 117 during a normal operating mode).

The DI_PWRPREP_ACK signal may be used by the device 104 to notify the controller 102 of the completion of requested actions (e.g., actions requested by the DI_PWRPREP signal). In one embodiment, the DI_PWRPREP_ACK signal is active high and its reset default is low.

The DI_CTRL_READY signal may be used by controller 102 to inform the device 104 that the I/O (e.g., Tx 108 and Rx 110) of its die interface 116 are ready in the desired state.

Figure 10:
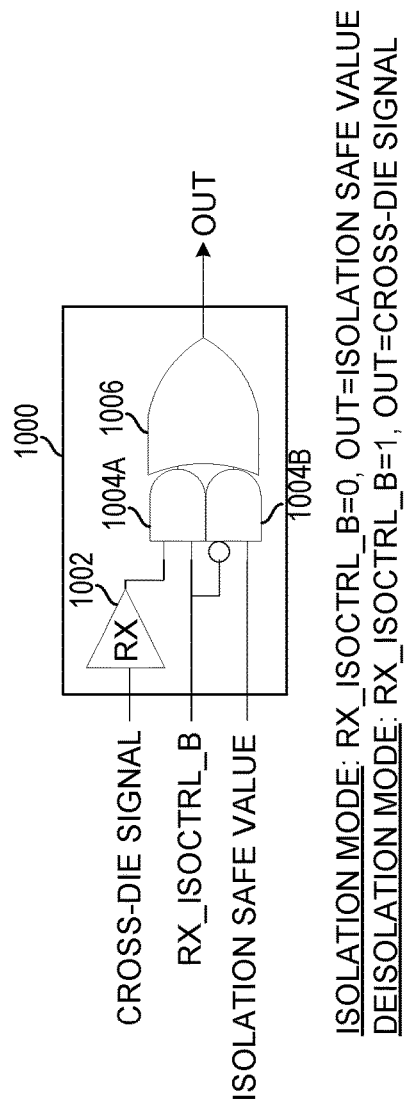
FIG. 10 illustrates a block diagram of an example receiver in accordance with certain embodiments.

FIG. 10 shows an example implementation of a receiver 1000, which could be the implementation used for Rx 110 and/or Rx 114. The receiver includes an Rx buffer 1002, a pair of AND gates 1004 and an OR gate 1006. A cross-die signal (e.g., a signal from a Tx driver of a different chip) is the input to the Rx buffer 1002. The output of the buffer and an RX_ISOCTRL_B signal is input into the first AND gate 1004A. The RX_ISOCTRL_B signal and an ISOLATION SAFE VALUE signal is input into the second AND gate 1004B. The outputs of the AND gates 1004 are provided as inputs to the OR gate 1006 and the output of the OR gate is the output of the receiver 1000.

When the receiver 1000 is placed in an isolation mode, the RX_ISOCTRL_B signal is set low, such that the output of the receiver 1000 is the ISOLATION SAFE VALUE signal (which could be any suitable logic level, such as a low or high voltage level). When the receiver 1000 is placed into a deisolation mode, the RX_ISOCTRL_B signal is set high, such that the output of the receiver 1000 is the CROSS-DIE SIGNAL. The deisolation mode is also referred to herein as the normal operating mode.

Figure 12:
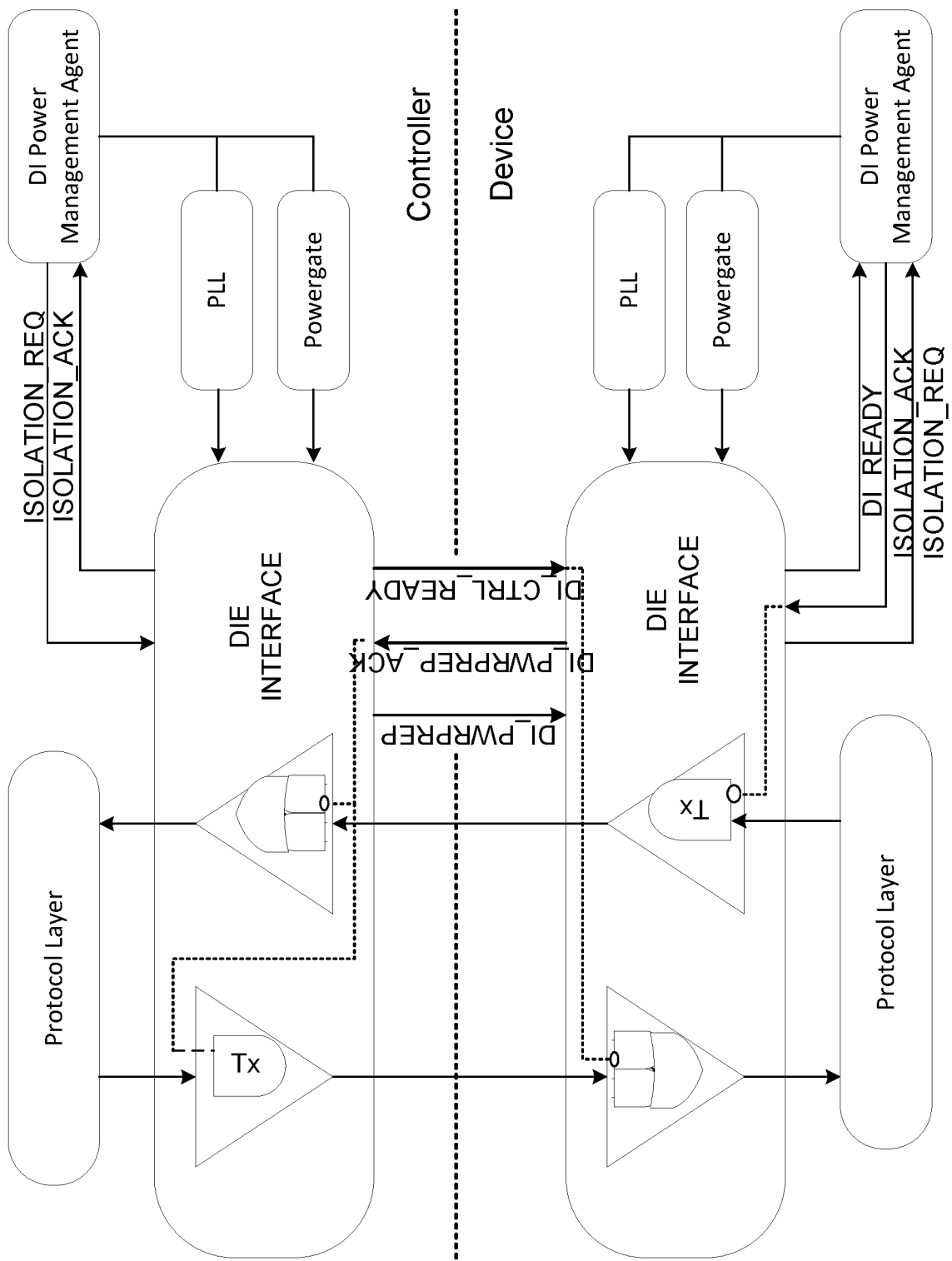
FIG. 12 illustrates example connectivity for a system to implement a modular low latency electrical sequence for a die-to-die interface in accordance with certain embodiments.

In some implementations (e.g., as illustrated in FIG. 12), when the Rx 110 is implemented as (or similar to) the receiver 1000, the CROSS-DIE SIGNAL may be coupled to the output of Tx 112 and the RX_ISOCTRL_B signal may be (or be derived from) the DI_PWRPREP_ACK signal. In various implementations, when the Rx 114 is implemented as (or similar to) the receiver 1000, the CROSS-DIE SIGNAL may be the output of Tx 108 and the RX_ISOCTRL_B signal may be (or be derived from) the DI_CTRL_READY signal.

Figure 11:
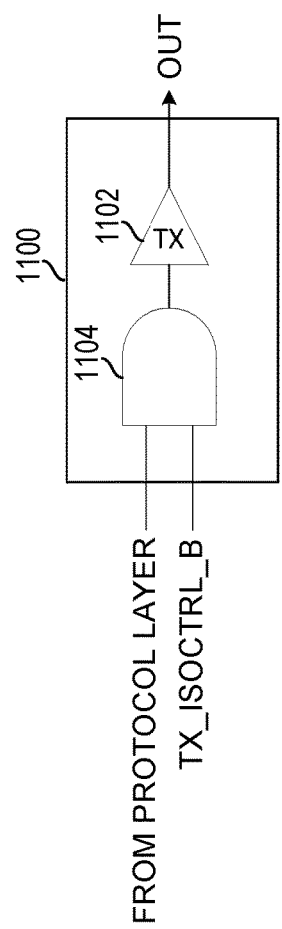
FIG. 11 illustrates a block diagram of an example transmitter in accordance with certain embodiments.

FIG. 11 shows an example implementation of a transmitter 1100, which could be the implementation used for Tx 108 and/or Tx 112. The transmitter includes a Tx driver 1102 coupled to the output of an AND gate 1104. A signal from a protocol layer and a TX_ISOCTRL_B signal are the inputs to the AND gate 1104.

When the transmitter 1100 is placed in an isolation mode, the TX_ISOCTRL_B signal is set low, such that the output of the transmitter 1100 is driven low. When the transmitter 1100 is placed into a deisolation mode, the TX_ISOCTRL_B signal is set high, such that the output of the transmitter 1100 is the signal from the protocol layer. Again, the deisolation mode of the transmitter is also referred to herein as the normal operating mode.

In some implementations (e.g., as illustrated in FIG. 12), when the Tx 108 is implemented as (or similar to) the transmitter 1100, the signal from the protocol layer may be received from protocol layer 115 and the TX_ISOCTRL_B signal may be (or be derived from) the DI_PWRPREP_ACK signal. In various implementations, when the Tx 112 is implemented as (or similar to) the transmitter 1100, the signal from the protocol layer may be received from protocol layer 117 and the TX_ISOCTRL_B signal may be (or be derived from) the ISOLATION_ACK signal from power management agent 126.

Figure 3:
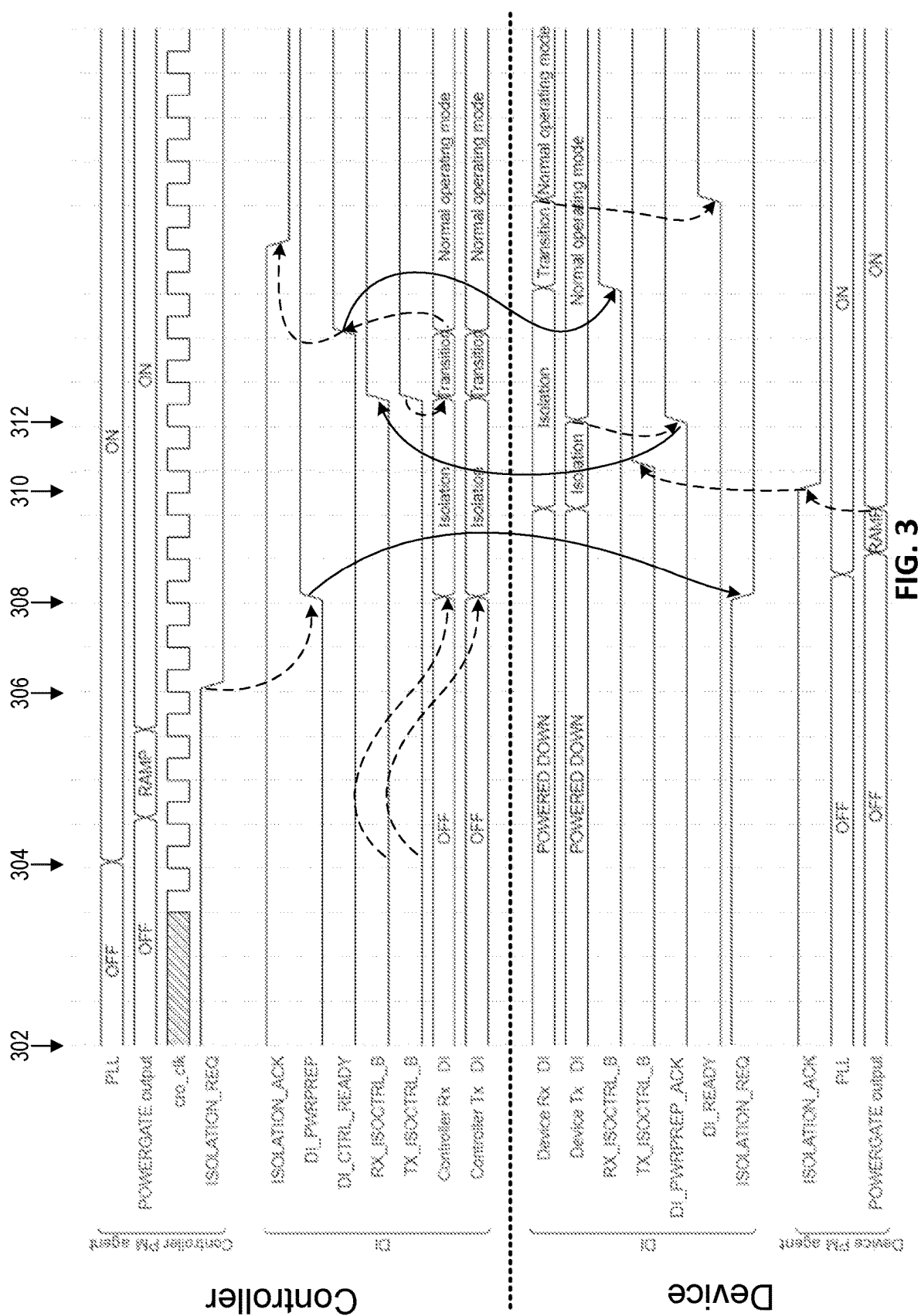
FIG. 3 illustrates a bring up sequence in accordance with certain embodiments.

FIG. 3 illustrates a bring up sequence in accordance with certain embodiments. The bring up sequence may manage electrical isolation on the die interface I/O. The sequence of FIG. 3 illustrates various states of components and signals of a dielet implementing the controller (e.g., 102) and a dielet implementing the device (e.g., 104).

Initially at 302, PLLs 128 and 130 and the outputs of powergates 132 and 134 are off. The Tx 108 and Rx 110 of the controller are also off and the Tx 112 and Rx 114 are powered down. At 304, the PLL 128 is turned on and then the output of the powergate 132 is ramped up to an ON state.

The electrical bring-up flow may be initiated by the power management agent 124 of the controller 102 upon assertion of a POWERGOOD signal indicating that the powergate output is on. A powergate may couple or decouple a voltage rail to a circuit (e.g., a die interface such as 116 or 118) when the powergate (e.g., a switch, such as a PMOS switch) is switched on or off. The POWERGOOD signal may be asserted when the associated power supply of the chip is fully ramped up and has reached steady state.

The bring-up flow may then begin at 306 with the power management agent 124 of the controller 102 transitioning (e.g., deasserting) the ISOLATION_REQ signal towards the finite state machine (FSM) 120 of the die interface 116. This results in placing of the Tx 108 and Rx 110 into isolation mode at 308 and triggering the transition (e.g., assertion) of the DI_PWRPREP signal by the controller 102 which may be sent as a direct wire signal (e.g., over a wire connecting the controller 102 to the device 104 that is dedicated to transporting the DI_PWRPREP signal) to the device 104 (in order to trigger the device to prepare to place its Tx 112 and Rx 114 into deisolation modes).

Responsive to the DI_PWRPREP signal, the FSM 122 of the die interface 118 of the device 104 may then transition (e.g., deassert) the ISOLATION_REQ signal towards the power management agent 126 of the device 104. The PLL 130 is also turned on and the output of the powergate 134 is ramped up. When the powergate output is on, the Tx 112 and Rx 114 are both in isolation mode.

Once the powergate output of the device 104 is on, the power management agent 126 may acknowledge the ISOLATION_REQ signal at 310 by transitioning (e.g., deasserting) ISOLATION_ACK. The FSM 122 will then begin to deisolate the Tx 112 of the device 104 to place the Tx 112 into a normal operation mode. At 312, the device 104 may then transition (e.g., assert) the DI_PWRPREP_ACK signal, which may also be a direct wire signal.

Upon receiving the acknowledgement signal DI_PWR-PREP_ACK, the FSM 120 of the controller 102 begins deisolation of both the Tx 108 and Rx 110 circuits. Once these circuits are in the correct state, the controller 102 will send another direct wire signal DI_CTRL_READY to the device 104. In response, the device 104 will now deisolate Rx 114 and assert the DI_READY signal to the power management agent 126 to signify that the die-to-die (D2D) link 106 is fully powered up (and thus to indicate that data from the protocol layers 115, 117 may be sent).

Figure 4:
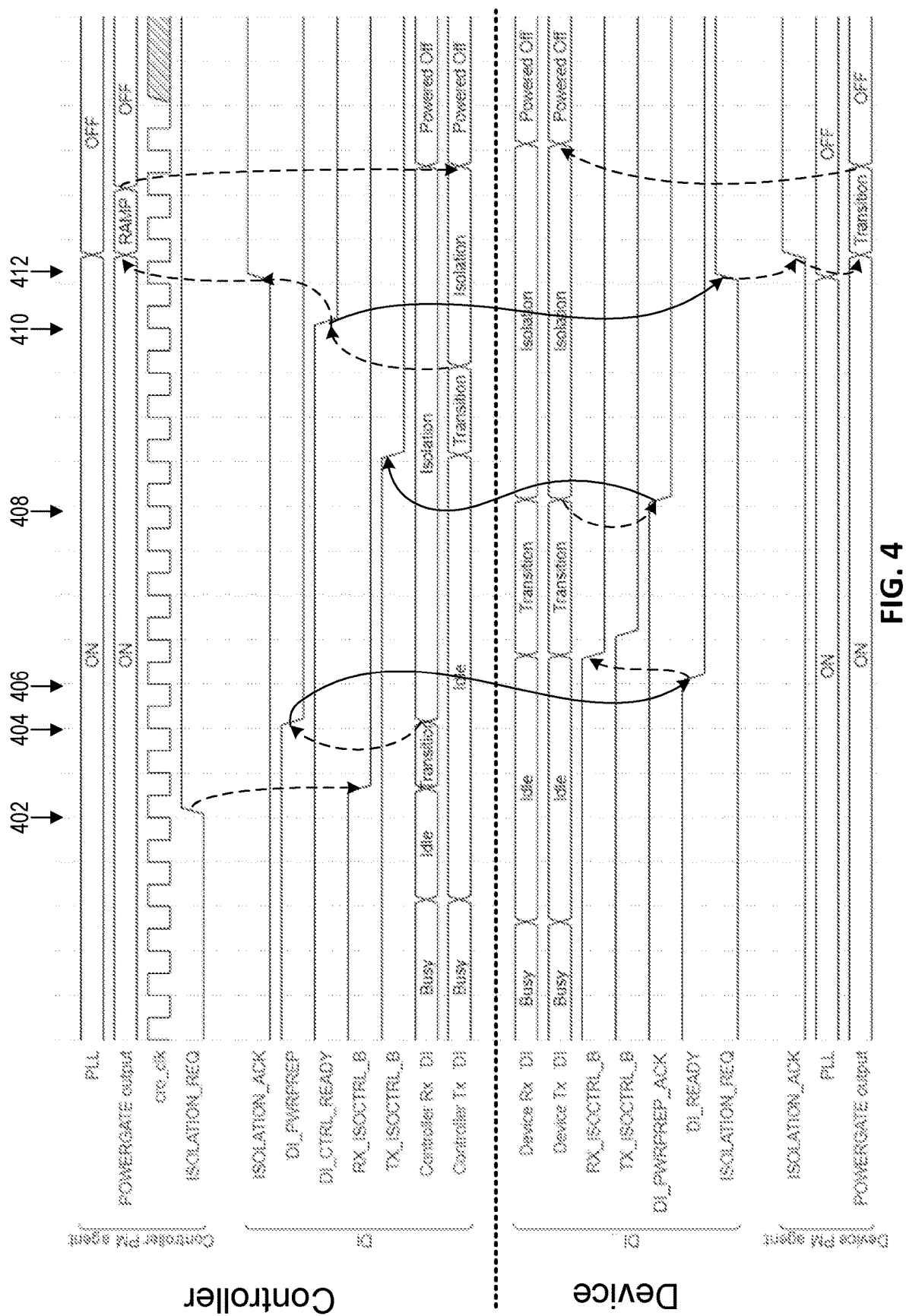
FIG. 4 illustrates a bring down sequence in accordance with certain embodiments.

FIG. 4 illustrates a bring down sequence in accordance with certain embodiments. Electrical bring down generally has a reverse sequence compared to the bring up sequence and is is also triggered by the power management agent 124 transitioning (e.g., asserting) the ISOLATION_REQ signal at 402. This signal initiates isolation of the Rx 110. The bring down sequence isolates the Rx 110 at 404 before the corresponding Tx 112 is isolated. This may prevent the Tx 112 from driving the incorrect state to the protocol layer (e.g., since an isolated Tx 112 may drive low).

Once the Rx 110 is isolated at 404, the controller 102 transitions (e.g., deasserts) the DI_PWRPREP to prepare for power down. The device 104 responds by transitioning (e.g., deasserting) DI_READY at 406 and transitioning both the Tx 112 and Rx 114 to isolation mode. Once isolation is achieved, the device 104 transitions (e.g., deasserts) the DI_PWRPREP_ACK signal at 408. In response, the Tx 108 is transitioned to isolation mode. The controller 102 then transitions (e.g., deasserts) the DI_CTRL_READY signal at 410 and then circuitry associated with the die interface 116 (such as PLL 128, powergate 132, Tx 108, and Rx 110) may be turned off. Upon detecting the transition of the DI_C-TRL_READY signal, the device 104 turns off circuitry associated with the die interface 118, such as PLL 130, powergate 134, Tx 112, and Rx 114.

Figure 5:
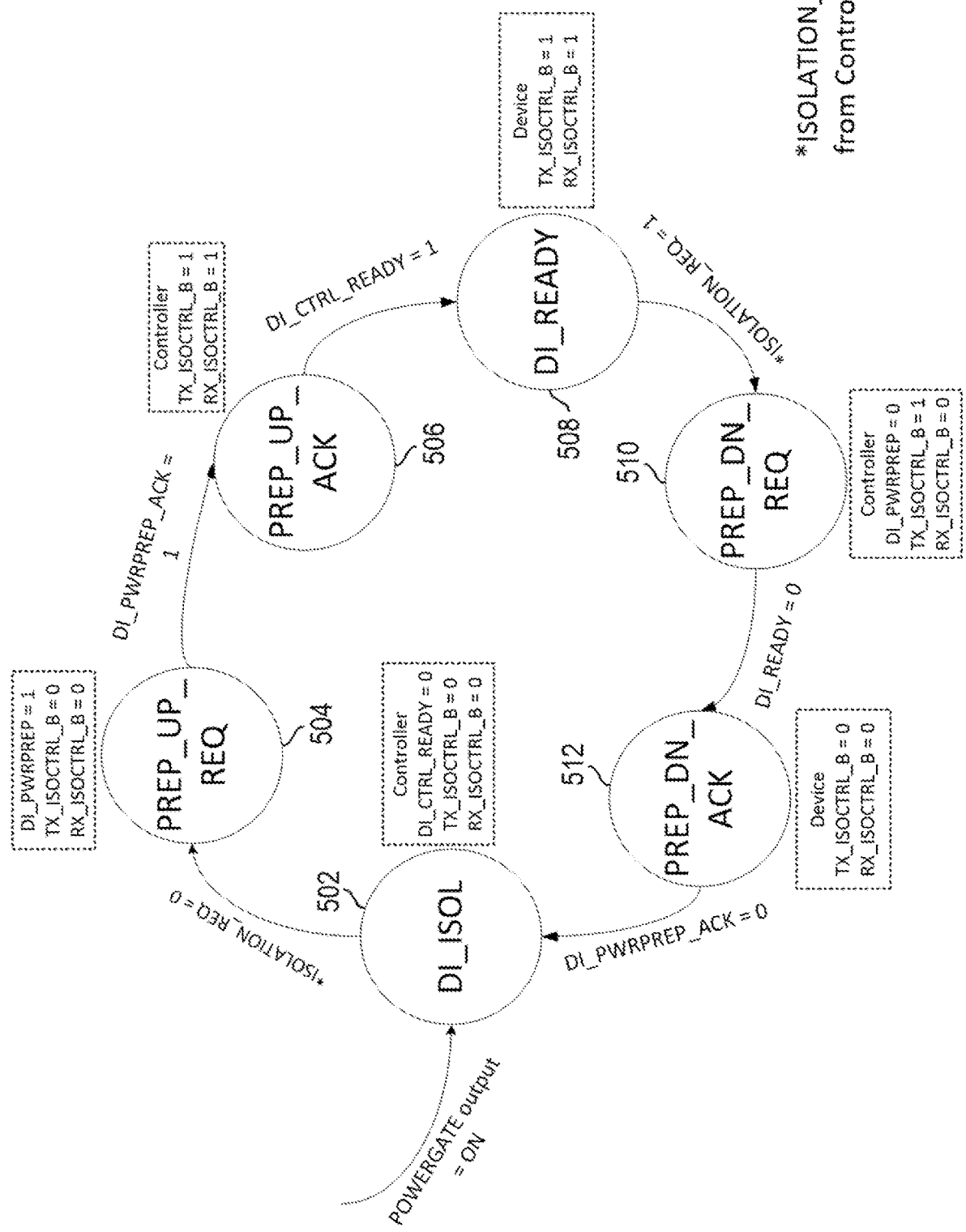
FIG. 5 illustrates a state machine in accordance with certain embodiments.

FIG. 5 illustrates a state machine in accordance with certain embodiments. The state machine may represent one example of FSM 120 of the controller 102. At 502, the FSM is in a DI_ISOL state (e.g., responsive to the output of the powergate 132 turning on). In this state, the DI_CTRL_READY, TX_ISOCTRL_B, and RX_ISOC-TRL_B signals of the controller are all deasserted.

Responsive to a transition (e.g., deassertion) of the ISO-LATION_REQ signal of the controller 102, the FSM moves to the PREP_UP_REQ state at 504. At the PREP_UP_REQ state, the DI_PWRPREP signal is asserted, and the TX_I-SOCTRL_B and RX_ISOCTRL_B signals of the controller are still deasserted.

Responsive to a transition (e.g., assertion) of the DI_P-WRPREP_ACK signal (e.g., from the device 104), the FSM moves to the PREP_UP_ACK state at 506. While in the PREP_UP_ACK state, the TX_ISOCTRL_B, and RX_ISO-CTRL_B signals of the controller are asserted.

Responsive to a transition (e.g., assertion) of the DI_C-TRL_READY signal, the FSM moves to the DI_READY state at 508. While the FSM is in the DI_READY state, the TX_ISOCTRL_B, and RX_ISOCTRL_B signals of the device are both asserted. The link is now up and may be used to transport data between, e.g., the protocol layers.

The transition of states from 502 through 508 may correspond to a power up sequence. A power down sequence may begin when the ISOLATION_REQ signal of the controller is transitions (e.g., asserted) and the FSM moves to the PREP_DN_REQ state at 510. In the PREP_DN_REQ state, the TX_ISOCTRL_B signal of the controller is asserted and the RX_ISOCTRL_B signal of the controller is deasserted (to begin placement of the Rx of the controller into an isolation state). The DI_PWRPREP signal is also deasserted.

Responsive to a transition (e.g., deassertion) of the DI_READY signal, the FSM moves to the PREP_DN_ACK state at 512. At the PREP_DN_ACK state, the TX_ISOC-TRL_B and RX_ISOCTRL_B signals of the device are deasserted to place the Tx and Rx of the device into an isolation state).

The FSM may then move back to the DI_ISOL state at 502 responsive to deassertion of the DI_PWRPREP_ACK signal. In this state, the DI_CTRL_READY, TX_ISOC-TRL_B, and RX_ISOCTRL_B signals of the controller are all deasserted (so the Tx of the controller is now also in an isolation state).

Figure 6:
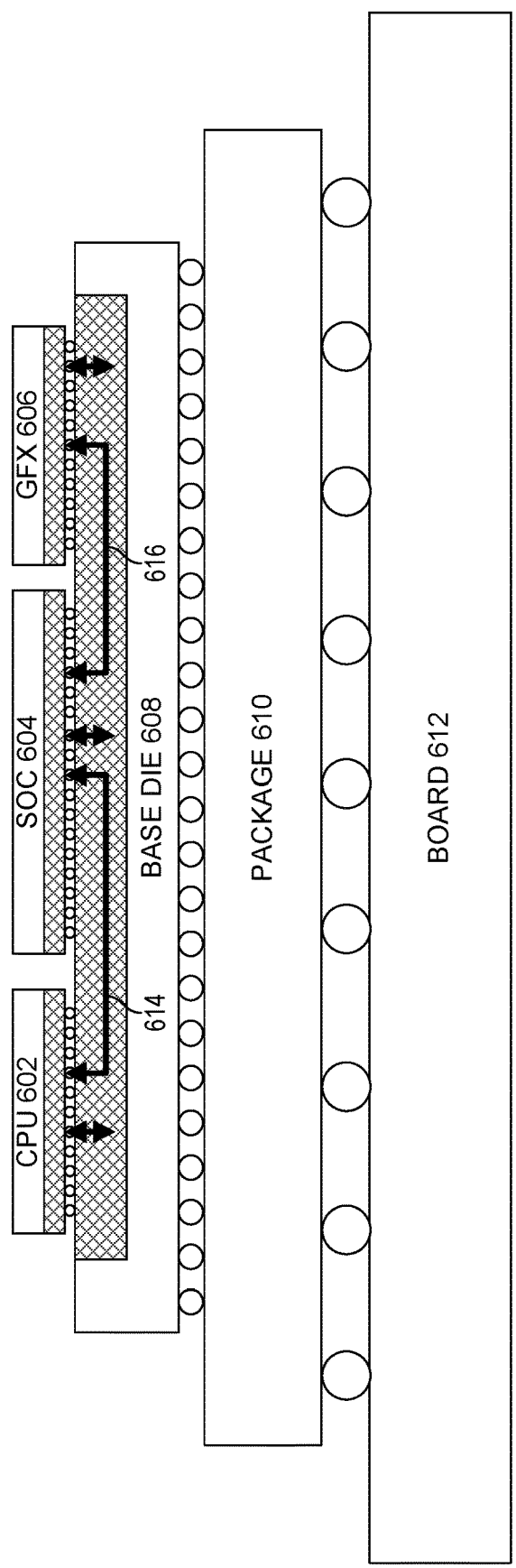
FIG. 6 illustrates a system with multiple die-to-die links in accordance with certain embodiments.

FIG. 6 illustrates a system 600 with multiple die-to-die links 614 and 616 in accordance with certain embodiments. System 600 includes a die comprising a central processing unit 602, a die comprising a system on chip (SOC) 604, and a die comprising a graphics processor (GFX) 606. Each of these dies is coupled (e.g., via soldering) to a base die 608. The resulting assembly is coupled (e.g., via soldering) to package 610 which may eventually be coupled (e.g., via soldering) to board 612.

In this embodiment, die-to-die link 614 may couple the CPU 602 to the SOC 604 and die-to-die link 616 may couple the SOC 604 to the GFX 606. Die-to-die links may also be present to couple a respective die (e.g., CPU 602, SOC 604, or GFX 606) to the base die 608.

Other systems may include any suitable number or types of dies. For example, a die may implement any suitable component, such as one or more of a processor core, graphics processing unit, hardware accelerator, field programmable gate array, neural network processing unit, artificial intelligence processing unit, inference engine, data processing unit, infrastructure processing unit, or memory.

In various embodiments, a die may function as a controller or a device (using the nomenclature described above, e.g., with respect to FIG. 1) for a particular link (e.g., a die may function as a controller if it is more ON than the opposite die which functions as a device). In one example, a die may function as a controller for a first die-to-die link and as a device for a second die-to-die link. In another example, a die may function as a device for a first die-to-die link and as a device for a second die-to-die link. As yet another example, a die may function as a controller for a first die-to-die link and as a controller for a second die-to-die link. In one embodiment, the die implementing the CPU 602 may function as a controller and the die implementing the SOC 604 may function as a device for the die-to-die link between the CPU 602 and the SOC 604. In an embodiment, the die implementing the GFX 602 may function as a controller and the die implementing the SOC 604 may function as the device for the die-to-die link between the GFX 606 and the SOC 604.

In various embodiments, any aspect of the architecture depicted in FIG. 1 or otherwise described herein may be replicated for various die-to-die links. For example, die-to-die link 614 may comprise the three wire interface for signals DI_PWRPREP, DI-PWERPREP_ACK, and DI_C-TRL_READY between the CPU 602 and the SOC 604, while die-to-die link 616 may comprise a separate three wire interface for another set of signals DI_PWRPREP, DI-PWERPREP_ACK, and DI_CTRL_READY between the SOC 604 and the GFX 606.

Figure 7:
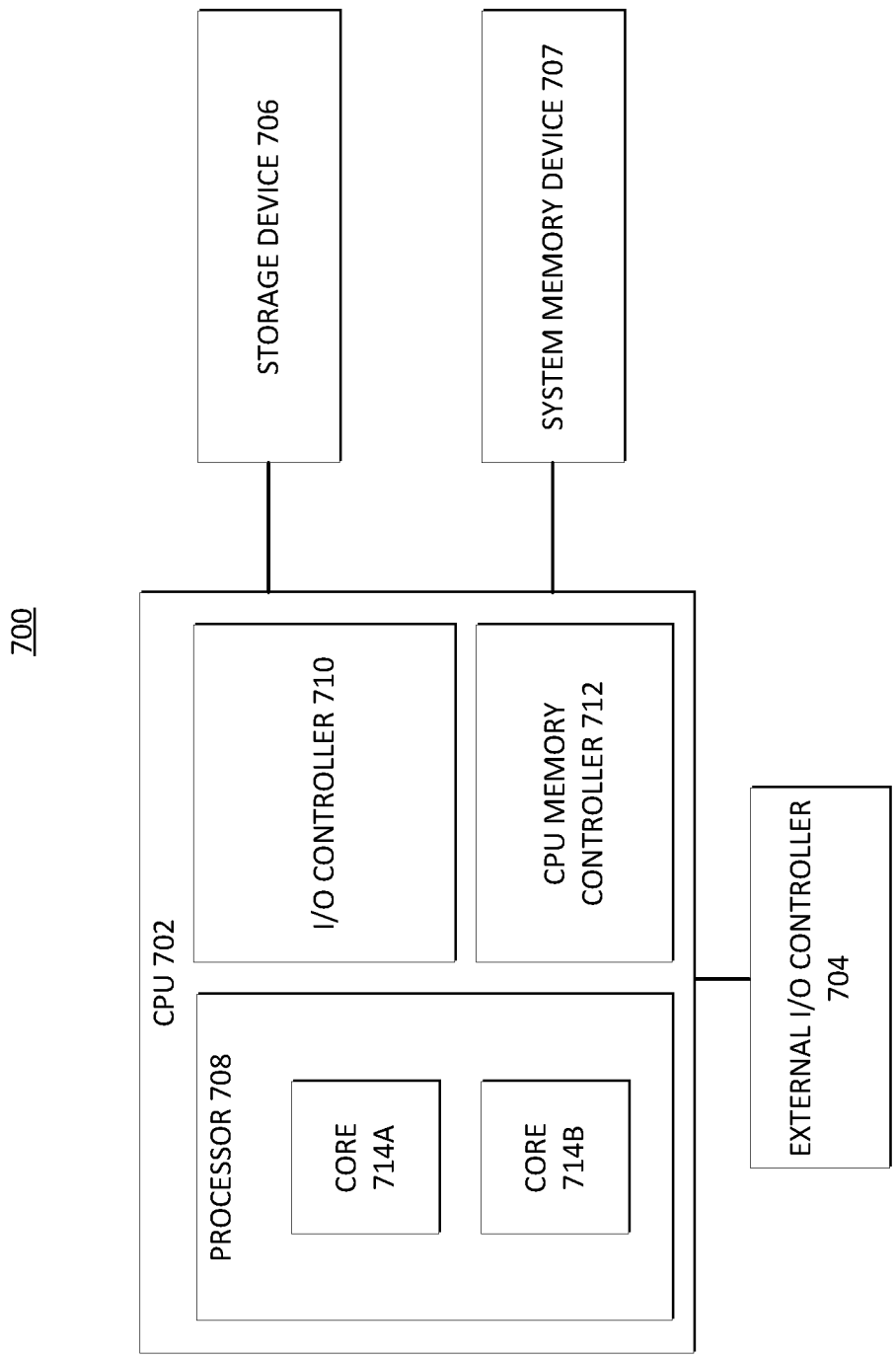
FIG. 7 illustrates components of a computer system in accordance with certain embodiments.
Figure 8:
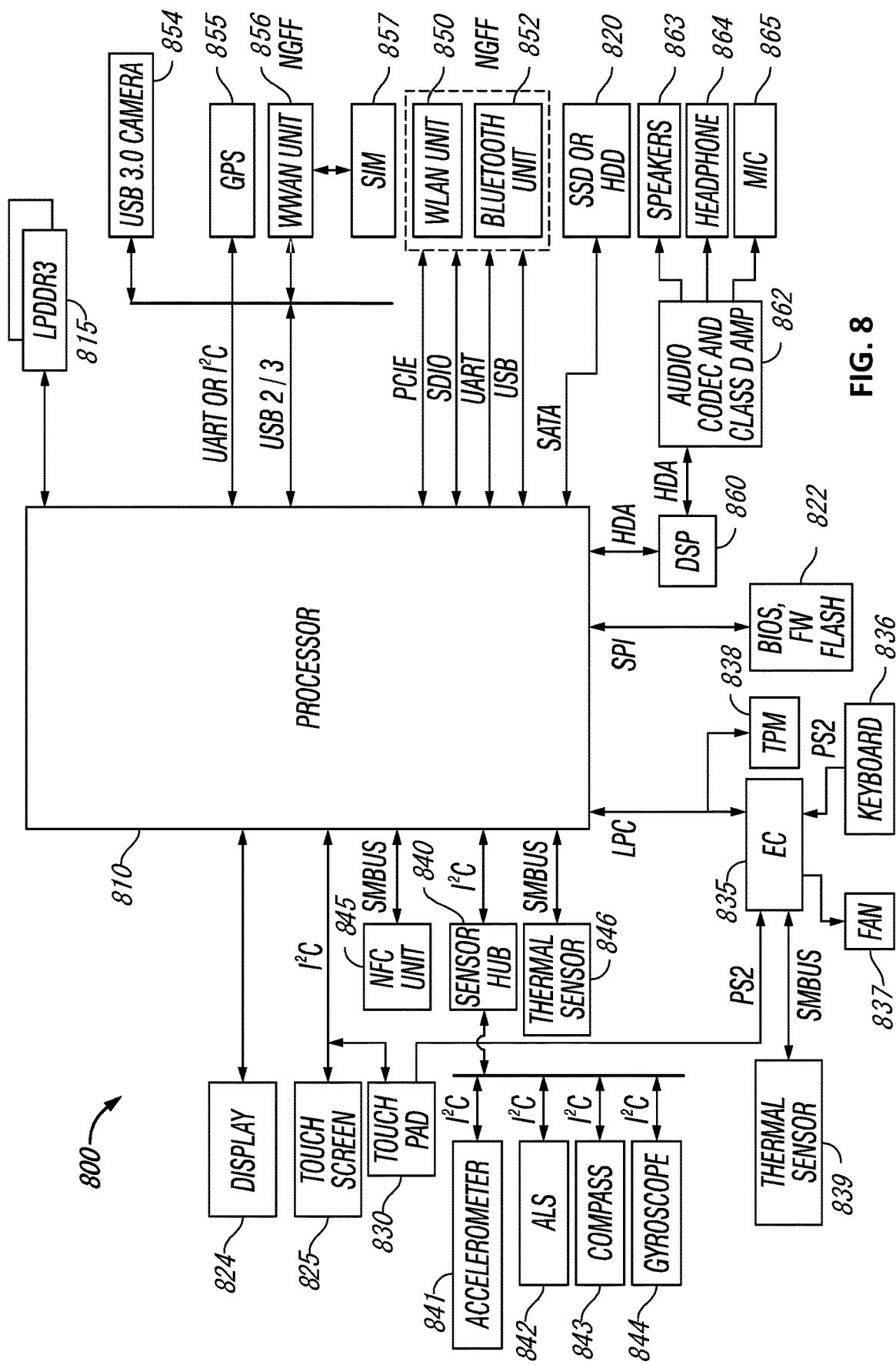
FIG. 8 illustrates a block diagram of components present in a computer system in accordance with certain embodiments.
Figure 9:
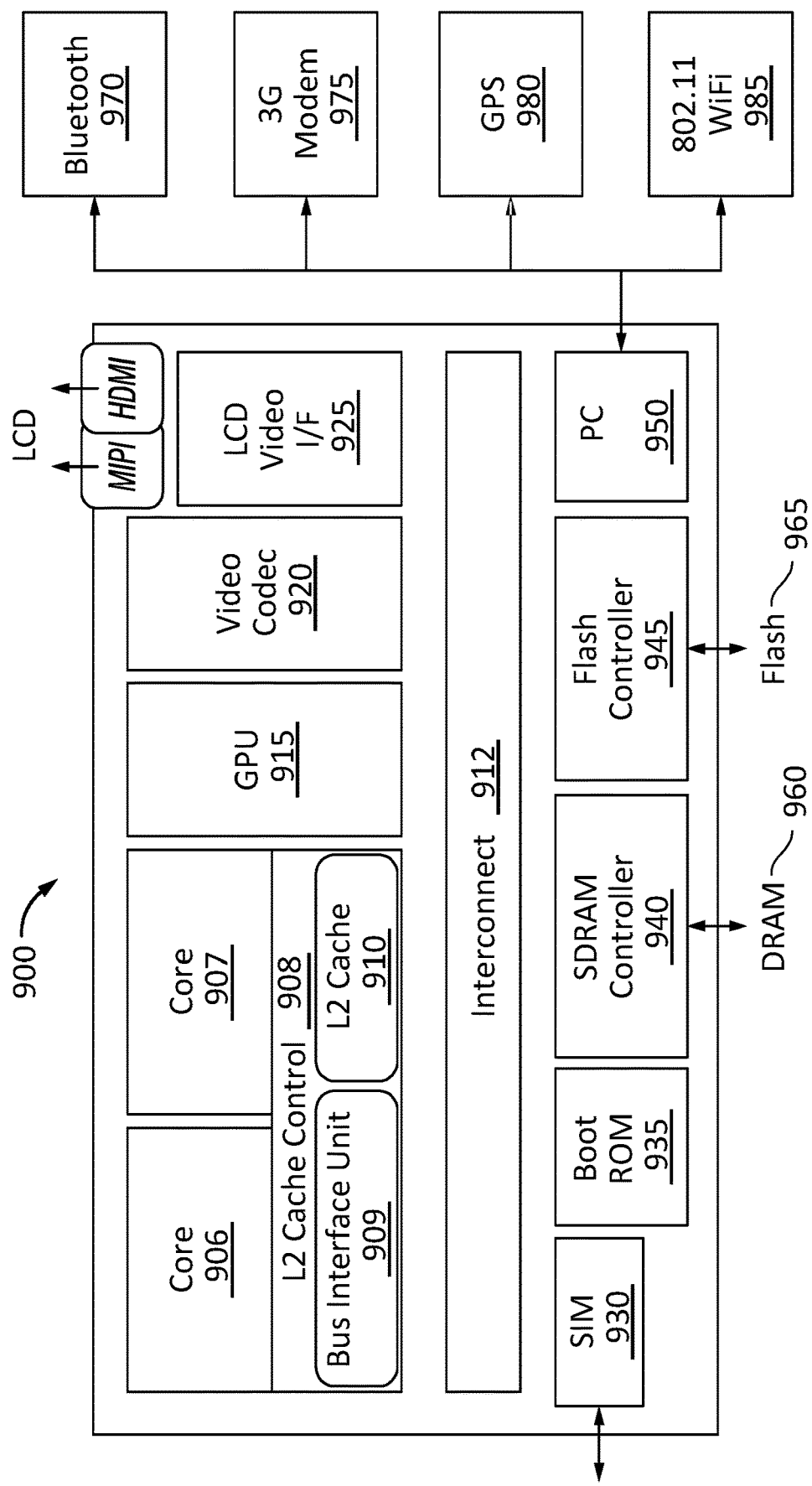
FIG. 9 illustrates a block diagram of an example computing system in accordance with certain embodiments.

FIGS. 7-9 depict example systems in which various embodiments described herein may be implemented. For example, any of the systems depicted (or one or more components thereof) may be included within system 100. For example, any of the components depicted may be implemented on a die functioning as a controller or device.

FIG. 7 illustrates components of a computer system 700 in accordance with certain embodiments. System 700 includes a central processing unit (CPU) 702 coupled to an external input/output (I/O) controller 704, a storage device 706 such as a solid state drive (SSD) or a dual inline memory module (DIMM), and system memory device 707. During operation, data may be transferred between a storage device 706 and/or system memory device 707 and the CPU 702. In various embodiments, particular memory access operations (e.g., read and write operations) involving a storage device 706 or system memory device 707 may be issued by an operating system and/or other software applications executed by processor 708.

CPU 702 comprises a processor 708, such as a microprocessor, an embedded processor, a digital signal processor (DSP), a network processor, a handheld processor, an application processor, a co-processor, an SOC, or other device to execute code (e.g., software instructions). Processor 708, in the depicted embodiment, includes two processing elements (cores 714A and 714B in the depicted embodiment), which may include asymmetric processing elements or symmetric processing elements. However, a processor may include any number of processing elements that may be symmetric or asymmetric. CPU 702 may be referred to herein as a host computing device (though a host computing device may be any suitable computing device operable to issue memory access commands to a storage device 706).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 714 (e.g., 714A or 714B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

In some embodiments, processor 708 may comprise a processor unit, such as a processor core, graphics processing unit, hardware accelerator, field programmable gate array, neural network processing unit, artificial intelligence processing unit, inference engine, data processing unit, or infrastructure processing unit.

I/O controller 710 is an integrated I/O controller that includes logic for communicating data between CPU 702 and I/O devices. In other embodiments, the I/O controller 710 may be on a different chip from the CPU 702. I/O devices may refer to any suitable devices capable of transferring data to and/or receiving data from an electronic system, such as CPU 702. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 706 coupled to the CPU 702 through I/O controller 710.

An I/O device may communicate with the I/O controller 710 of the CPU 702 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 710 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 710 may be located off-chip (e.g., not on the same chip as CPU 702) or may be integrated on the same chip as the CPU 702.

CPU memory controller 712 is an integrated memory controller that controls the flow of data going to and from one or more system memory devices 707. CPU memory controller 712 may include logic operable to read from a system memory device 707, write to a system memory device 707, or to request other operations from a system memory device 707. In various embodiments, CPU memory controller 712 may receive write requests from cores 714 and/or I/O controller 710 and may provide data specified in these requests to a system memory device 707 for storage therein. CPU memory controller 712 may also read data from a system memory device 707 and provide the read data to I/O controller 710 or a core 714. During operation, CPU memory controller 712 may issue commands including one or more addresses of the system memory device 707 in order to read data from or write data to memory (or to perform other operations). In some embodiments, CPU memory controller 712 may be implemented on the same chip as CPU 702, whereas in other embodiments, CPU memory controller 712 may be implemented on a different chip than that of CPU 702. I/O controller 710 may perform similar operations with respect to one or more storage devices 706.

The CPU 702 may also be coupled to one or more other I/O devices through external I/O controller 704. In a particular embodiment, external I/O controller 704 may couple a storage device 706 to the CPU 702. External I/O controller 704 may include logic to manage the flow of data between one or more CPUs 702 and I/O devices. In particular embodiments, external I/O controller 704 is located on a motherboard along with the CPU 702. The external I/O controller 704 may exchange information with components of CPU 702 using point-to-point or other interfaces.

A system memory device 707 may store any suitable data, such as data used by processor 708 to provide the functionality of computer system 700. For example, data associated with programs that are executed or files accessed by cores 714 may be stored in system memory device 707. Thus, a system memory device 707 may include a system memory that stores data and/or sequences of instructions that are executed or otherwise used by the cores 714. In various embodiments, a system memory device 707 may store temporary data, persistent data (e.g., a user's files or instruction sequences) that maintains its state even after power to the system memory device 707 is removed, or a combination thereof. A system memory device 707 may be dedicated to a particular CPU 702 or shared with other devices (e.g., one or more other processors or other devices) of computer system 700.

In various embodiments, a system memory device 707 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 706 may store any suitable data, such as data used by processor 708 to provide functionality of computer system 700. For example, data associated with programs that are executed or files accessed by cores 714A and 714B may be stored in storage device 706. Thus, in some embodiments, a storage device 706 may store data and/or sequences of instructions that are executed or otherwise used by the cores 714A and 714B. In various embodiments, a storage device 706 may store persistent data (e.g., a user's files or software application code) that maintains its state even after power to the storage device 706 is removed. A storage device 706 may be dedicated to CPU 702 or shared with other devices (e.g., another CPU or other device) of computer system 700.

In various embodiments, storage device 706 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, a semiconductor chip may be embodied in a semiconductor package. In various embodiments, a semiconductor package may comprise a casing comprising one or more semiconductor chips (also referred to as dies). A package may also comprise contact pins or leads used to connect to external circuits.

In some embodiments, all or some of the elements of system 700 are resident on (or coupled to) the same circuit board (e.g., a motherboard). In various embodiments, any suitable partitioning between the elements may exist. For example, the elements depicted in CPU 702 may be located on a single die (e.g., on-chip) or package or any of the elements of CPU 702 may be located off-chip or off-package. Similarly, the elements depicted in storage device 706 may be located on a single chip or on multiple chips. In various embodiments, a storage device 706 and a computing host (e.g., CPU 702) may be located on the same circuit board or on the same device and in other embodiments the storage device 706 and the computing host may be located on different circuit boards or devices.

The components of system 700 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 700, such as cores 714, one or more CPU memory controllers 712, I/O controller 710, integrated I/O devices, direct memory access (DMA) logic (not shown), etc. In various embodiments, components of computer system 700 may be coupled together through one or more networks comprising any number of intervening network nodes, such as routers, switches, or other computing devices. For example, a computing host (e.g., CPU 702) and the storage device 706 may be communicably coupled through a network.

Although not depicted, system 700 may use a battery and/or power supply outlet connector and associated system to receive power, a display to output data provided by CPU 702, or a network interface allowing the CPU 702 to communicate over a network. In various embodiments, the battery, power supply outlet connector, display, and/or network interface may be communicatively coupled to CPU 702. Other sources of power can be used such as renewable energy (e.g., solar power or motion based power).

Referring now to FIG. 8, a block diagram of components present in a computer system that may function as either a host device or a peripheral device (or which may include both a host device and one or more peripheral devices) in accordance with certain embodiments is described. As shown in FIG. 8, system 800 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 8 is intended to show a high level view of many components of the computer system. However, it is to be understood that some of the components shown may be omitted, additional components may be present, and different arrangement of the components shown may occur in other implementations. As a result, the disclosure described above may be implemented in any portion of one or more of the interconnects illustrated or described below.

As seen in FIG. 8, a processor 810, in one embodiment, includes a microprocessor, multi-core processor, multi-threaded processor, an ultra-low voltage processor, an embedded processor, or other known processing element. In the illustrated implementation, processor 810 acts as a main processing unit and central hub for communication with many of the various components of the system 800. As one example, processor 810 is implemented as a system on a chip (SoC). As a specific illustrative example, processor 810 includes an Intel® Architecture Core™-based processor such as an i3, i5, i7 or another such processor available from Intel Corporation, Santa Clara, CA. However, other low power processors such as those available from Advanced Micro Devices, Inc. (AMD) of Sunnyvale, CA, a MIPS-based design from MIPS Technologies, Inc. of Sunnyvale, CA, an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitecture implementation may vary, but the architectural function of the processor is usually consistent. Certain details regarding the architecture and operation of processor 810 in one implementation will be discussed further below to provide an illustrative example.

Processor 810, in one embodiment, communicates with a system memory 815. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (QDP). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 820 may also couple to processor 810. In various embodiments, to enable a thinner and lighter system design as well as to improve system responsiveness, this mass storage may be implemented via a SSD. However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 8, a flash device 822 may be coupled to processor 810, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 800. Specifically shown in the embodiment of FIG. 8 is a display 824 which may be a high definition LCD or LED panel configured within a lid portion of the chassis. This display panel may also provide for a touch screen 825, e.g., adapted externally over the display panel such that via a user's interaction with this touch screen, user inputs can be provided to the system to enable desired operations, e.g., with regard to the display of information, accessing of information and so forth. In one embodiment, display 824 may be coupled to processor 810 via a display interconnect that can be implemented as a high performance graphics interconnect. Touch screen 825 may be coupled to processor 810 via another interconnect, which in an embodiment can be an I2C interconnect. As further shown in FIG. 8, in addition to touch screen 825, user input by way of touch can also occur via a touch pad 830 which may be configured within the chassis and may also be coupled to the same I2C interconnect as touch screen 825.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited I/O interference when using multi-touch.

For perceptual computing and other purposes, various sensors may be present within the system and may be coupled to processor 810 in different manners. Certain inertial and environmental sensors may couple to processor 810 through a sensor hub 840, e.g., via an I2C interconnect. In the embodiment shown in FIG. 8, these sensors may include an accelerometer 841, an ambient light sensor (ALS) 842, a compass 843 and a gyroscope 844. Other environmental sensors may include one or more thermal sensors 846 which in some embodiments couple to processor 810 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example, with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

Also seen in FIG. 8, various peripheral devices may couple to processor 810. In the embodiment shown, various components can be coupled through an embedded controller 835. Such components can include a keyboard 836 (e.g., coupled via a PS2 interface), a fan 837, and a thermal sensor 839. In some embodiments, touch pad 830 may also couple to EC 835 via a PS2 interface. In addition, a security processor such as a trusted platform module (TPM) 838 in accordance with the Trusted Computing Group (TCG) TPM Specification Version 1.2, dated Oct. 2, 2003, may also couple to processor 810 via this LPC interconnect. However, understand the scope of the present disclosure is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus (USB) Revision 3.2 Specification (September 2017), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 800 can communicate with external devices in a variety of manners, including wirelessly. In the embodiment shown in FIG. 8, various wireless modules, each of which can correspond to a radio configured for a particular wireless communication protocol, are present. One manner for wireless communication in a short range such as a near field may be via a near field communication (NFC) unit 845 which may communicate, in one embodiment with processor 810 via an SMBus. Note that via this NFC unit 845, devices in close proximity to each other can communicate. For example, a user can enable system 800 to communicate with another portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 8, additional wireless units can include other short range wireless engines including a WLAN unit 850 and a Bluetooth unit 852. Using WLAN unit 850, Wi-Fi™ communications in accordance with a given Institute of Electrical and Electronics Engineers (IEEE) 802.11 standard can be realized, while via Bluetooth unit 852, short range communications via a Bluetooth protocol can occur. These units may communicate with processor 810 via, e.g., a USB link or a universal asynchronous receiver transmitter (UART) link. Or these units may couple to processor 810 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 856 which in turn may couple to a subscriber identity module (SIM) 857. In addition, to enable receipt and use of location information, a GPS module 855 may also be present. Note that in the embodiment shown in FIG. 8, WWAN unit 856 and an integrated capture device such as a camera module 854 may communicate via a given USB protocol such as a USB 2.0 or 3.0 link, or a UART or I2C protocol. Again, the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 860, which may couple to processor 810 via a high definition audio (HDA) link. Similarly, DSP 860 may communicate with an integrated coder/decoder (CODEC) and amplifier 862 that in turn may couple to output speakers 863 which may be implemented within the chassis. Similarly, amplifier and CODEC 862 can be coupled to receive audio inputs from a microphone 865 which in an embodiment can be implemented via dual array microphones (such as a digital microphone array) to provide for high quality audio inputs to enable voice-activated control of various operations within the system. Note also that audio outputs can be provided from amplifier/CODEC 862 to a headphone jack 864. Although shown with these particular components in the embodiment of FIG. 8, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 810 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

Power control in the processor can lead to enhanced power savings. For example, power can be dynamically allocated between cores, individual cores can change frequency/voltage, and multiple deep low power states can be provided to enable very low power consumption. In addition, dynamic control of the cores or independent core portions can provide for reduced power consumption by powering off components when they are not being used.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TxT), and Intel® Manageability Engine Technology along with secure user interfaces such as a secure keyboard and display.

Turning next to FIG. 9, another block diagram for an example computing system that may serve as a host device or peripheral device (or may include both a host device and one or more peripheral devices) in accordance with certain embodiments is shown. As a specific illustrative example, SoC 900 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SoC 900 includes 2 cores—906 and 907. Similar to the discussion above, cores 906 and 907 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 906 and 907 are coupled to cache control 908 that is associated with bus interface unit 909 and L2 cache 910 to communicate with other parts of system 900. Interconnect 912 includes an on-chip interconnect, such as an IOSF, AMBA, or other interconnect discussed above, which potentially implements one or more aspects of the described disclosure.

Interconnect 912 provides communication channels to the other components, such as a Subscriber Identity Module (SIM) 930 to interface with a SIM card, a boot rom 935 to hold boot code for execution by cores 906 and 907 to initialize and boot SoC 900, a SDRAM controller 940 to interface with external memory (e.g. DRAM 960), a flash controller 945 to interface with non-volatile memory (e.g. Flash 965), a peripheral control 950 (e.g. Serial Peripheral Interface) to interface with peripherals, video codecs 920 and Video interface 925 to display and receive input (e.g. touch enabled input), GPU 915 to perform graphics related computations, etc. Any of these interfaces may incorporate aspects of the disclosure described herein.

In addition, the system illustrates peripherals for communication, such as a Bluetooth module 970, 3G modem 975, GPS 980, and WiFi 985. Note as stated above, a UE includes a radio for communication. As a result, these peripheral communication modules are not all required. However, in a UE some form of a radio for external communication is to be included.

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include, e.g., a microcontroller, a digital signal processor (DSP), an SOC, a network computer (NetPC), a set-top box, a network hub, a wide area network (WAN) switch, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein or as depicted in the FIGS. refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components of the FIGS., subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1 's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 includes a system comprising a first die comprising a first receiver and a first transmitter to couple to a link between the first die and a second die comprising a second receiver and a second transmitter; and circuitry to place the first receiver and first transmitter into isolation modes; provide a first signal to the second die to request placement of the second transmitter into a deisolation mode; place the first receiver and first transmitter into deisolation modes responsive to a second signal from the second die; and provide a third signal to the second die to request placement of the second receiver into a deisolation mode.

Example 2 includes the subject matter of Example 1, and wherein the first signal is sent over a first wire dedicated to the first signal; the second signal is sent over a second wire dedicated to the second signal; and the third signal is sent over a third wire dedicated to the third signal.

Example 3 includes the subject matter of any of Examples 1 and 2, and further including the first wire, second wire, and third wire.

Example 4 includes the subject matter of any of Examples 1-3, and further including the second die.

Example 5 includes the subject matter of any of Examples 1-4, and wherein the first die comprises a processor to generate data to be communicated over the link.

Example 6 includes the subject matter of any of Examples 1-5, and further including a battery communicatively coupled to the processor, a display communicatively coupled to the processor, or a network interface communicatively coupled to the processor.

Example 7 includes the subject matter of any of Examples 1-6, and wherein placing the first receiver into an isolation mode comprises driving an output of the receiver to a fixed logical value.

Example 8 includes the subject matter of any of Examples 1-7, and wherein placing the first transmitter into an isolation mode comprises driving an output of the transmitter to a low voltage value.

Example 9 includes the subject matter of any of Examples 1-8, and wherein placing the first receiver into a deisolation mode comprises configuring the first receiver to output an output of the second transmitter.

Example 10 includes the subject matter of any of Examples 1-9, and wherein placing the first transmitter into a deisolation mode comprises configuring the first transmitter to output an output of a protocol layer of the first die.

Example 11 includes the subject matter of any of Examples 1-10, and wherein the circuitry is, during a power off flow, to transition the first receiver from a deisolation mode to an isolation mode; transition the first signal to request placement of the second receiver and second transmitter into isolation modes; and transition the first transmitter from a deisolation mode to an isolation mode responsive to a transition of the second signal.

Example 12 includes the subject matter of any of Examples 1-11, and wherein the circuitry is to power off the first receiver and the first transmitter after transitioning the first transmitter to the isolated mode.

Example 13 includes the subject matter of any of Examples 1-11, and wherein the first die comprises a central processing unit or graphics processing unit and the second die comprises a system on a die.

Example 14 includes an apparatus comprising a first die comprising a first receiver and a first transmitter to couple to a link between the first die and a second die comprising a second receiver and a second transmitter; and circuitry to place the first transmitter into an isolation mode when the second receiver is to be powered down; and place the first receiver into an isolation mode when the second transmitter is to be powered down.

Example 15 includes the subject matter of Example 14, and wherein placing the first transmitter into the isolation mode comprises driving the output of the first transmitter to a low voltage.

Example 16 includes the subject matter of any of Examples 14 and 15, and wherein placing the first receiver into the isolation mode comprises driving the output of the first receiver to a fixed logical value.

Example 17 includes the subject matter of any of Examples 14-16, and wherein the circuitry is to transition a first signal to request isolation or deisolation of the second receiver and the second transmitter.

Example 18 includes the subject matter of any of Examples 14-17, wherein the circuitry is to transition the first receiver and the first transmitter to deisolation modes responsive to a signal received from the second die.

Example 19 includes a method comprising bringing up a link between a first die and a second die, the bring up link including isolating a first transmitter and a first receiver of the first die and a second transmitter and a second receiver of the second die; deisolating the second transmitter while the first receiver is still isolated; deisolating the first receiver and the first transmitter while the second receiver is still isolated; and deisolating the second receiver after the first receiver and the first transmitter are deisolated.

Example 20 includes the subject matter of Example 19, and further including taking down the link, the taking down the link including isolating the first receiver; isolating the second receiver and the second transmitter after isolating the first receiver; and isolating the first transmitter after isolating the second receiver and the second transmitter.

Example 21 includes the subject matter of any of Examples 19-20, and further including placing the first receiver and first transmitter into isolation modes; providing a first signal to the second die to request placement of the second transmitter into a deisolation mode; placing the first receiver and first transmitter into deisolation modes responsive to a second signal from the second die; and providing a third signal to the second die to request placement of the second receiver into a deisolation mode.

Example 22 includes the subject matter of any of Examples 19-21, and wherein the first signal is sent over a first wire dedicated to the first signal; the second signal is sent over a second wire dedicated to the second signal; and the third signal is sent over a third wire dedicated to the third signal.

Example 23 includes the subject matter of any of Examples 19-22, and wherein the first die comprises a processor to generate data to be communicated over the link.

Example 24 includes the subject matter of any of Examples 19-23, and further including communicatively coupling the processor to a battery, a display, or a network interface.

Example 25 includes the subject matter of any of Examples 19-24, and wherein placing the first receiver into an isolation mode comprises driving an output of the receiver to a fixed logical value.

Example 26 includes the subject matter of any of Examples 19-25, and wherein placing the first transmitter into an isolation mode comprises driving an output of the transmitter to a low voltage value.

Example 27 includes the subject matter of any of Examples 19-26, and wherein placing the first receiver into a deisolation mode comprises configuring the first receiver to output an output of the second transmitter.

Example 28 includes the subject matter of any of Examples 19-27, and wherein placing the first transmitter into a deisolation mode comprises configuring the first transmitter to output an output of a protocol layer of the first die.

Example 29 includes the subject matter of any of Examples 19-28, and further including, during a power off flow, transitioning the first receiver from a deisolation mode to an isolation mode; transition the first signal to request placement of the second receiver and second transmitter into isolation modes; and transition the first transmitter from a deisolation mode to an isolation mode responsive to a transition of the second signal.

Example 30 includes the subject matter of any of Examples 19-29, and further including powering off the first receiver and the first transmitter after transitioning the first transmitter to the isolated mode.

Example 31 includes the subject matter of any of Examples 19-30, and wherein the first die comprises a central processing unit or graphics processing unit and the second die comprises a system on a die.

Example 32 includes circuitry to perform any combination of the operations of 19-31.

What is claimed is:

1. A system comprising:
a first die in a package, the first die comprising:
a first receiver and a first transmitter to couple to a link between the first die and a second die in the package, the second die comprising a second receiver and a second transmitter; and
circuitry to:
place the first receiver and first transmitter into isolation modes;
provide a first signal to the second die to request placement of the second transmitter into a deisolation mode;
place the first receiver and first transmitter into deisolation modes responsive to a second signal from the second die; and
provide a third signal to the second die to request placement of the second receiver into a deisolation mode.

2. The system of claim 1, wherein:
the first signal is sent over a first wire dedicated to the first signal;
the second signal is sent over a second wire dedicated to the second signal; and
the third signal is sent over a third wire dedicated to the third signal.

3. The system of claim 2, further comprising the first wire, second wire, and third wire.

4. The system of claim 3, further comprising the second die.

5. The system of claim 4, wherein the first die comprises a processor to generate data to be communicated over the link.

6. The system of claim 5, further comprising a battery communicatively coupled to the processor, a display communicatively coupled to the processor, or a network interface communicatively coupled to the processor.

7. The system of claim 1, wherein placing the first receiver into an isolation mode comprises driving an output of the receiver to a fixed logical value.

8. The system of claim 1, wherein placing the first transmitter into an isolation mode comprises driving an output of the transmitter to a low voltage value.

9. The system of claim 1, wherein placing the first receiver into a deisolation mode comprises configuring the first receiver to output an output of the second transmitter.

10. The system of claim 1, wherein placing the first transmitter into a deisolation mode comprises configurating the first transmitter to output an output of a protocol layer of the first die.

11. The system of claim 1, wherein the circuitry is, during a power off flow, to:
transition the first receiver from a deisolation mode to an isolation mode;
transition the first signal to request placement of the second receiver and second transmitter into isolation modes; and
transition the first transmitter from a deisolation mode to an isolation mode responsive to a transition of the second signal.

12. The system of claim 11, wherein the circuitry is to power off the first receiver and the first transmitter after transitioning the first transmitter to the isolated mode.

13. The system of claim 1, wherein the first die comprises a central processing unit or graphics processing unit and the second die comprises a system on a die.

14. An apparatus comprising:
a first die in a package, the first die comprising:
a first receiver and a first transmitter to couple to a link between the first die and a second die in the package, the second die comprising a second receiver and a second transmitter; and
circuitry to:
place the first transmitter into an isolation mode when the second receiver is to be powered down; and
place the first receiver into an isolation mode when the second transmitter is to be powered down.

15. The apparatus of claim 14, wherein placing the first transmitter into the isolation mode comprises driving the output of the first transmitter to a low voltage.

16. The apparatus of claim 14, wherein placing the first receiver into the isolation mode comprises driving the output of the first receiver to a fixed logical value.

17. The apparatus of claim 14, wherein the circuitry is to transition a first signal to request isolation or deisolation of the second receiver and the second transmitter.

18. The apparatus of claim 14, wherein the circuitry is to transition the first receiver and the first transmitter to deisolation modes responsive to a signal received from the second die.

19. An apparatus comprising:
circuitry to bring up a link between a first die in a package and a second die in the package, wherein bringing up the link comprises:
isolating a first transmitter and a first receiver of the first die and a second transmitter and a second receiver of the second die;
deisolating the second transmitter while the first receiver is still isolated;
deisolating the first receiver and the first transmitter while the second receiver is still isolated; and
deisolating the second receiver after the first receiver and the first transmitter are deisolated.

20. The apparatus of claim 19, the circuitry further to take down the link, wherein taking down the link comprises:
isolating the first receiver;
isolating the second receiver and the second transmitter after isolating the first receiver; and
isolating the first transmitter after isolating the second receiver and the second transmitter.

* * * * *